United States Patent [19]

Morrison et al.

[11] 4,286,230

[45] Aug. 25, 1981

[54] NEAR MILLIMETER WAVE GENERATOR WITH DIELECTRIC CAVITY

[75] Inventors: Clyde A. Morrison, Wheaton; Donald E. Wortman, Rockville; Richard P. Leavitt, Berwyn Heights; Nick Karayianis, Rockville, all of Md.

[73] Assignee: The United States of America as represented by the Secretary of the Army, Washington, D.C.

[21] Appl. No.: 110,955

[22] Filed: Jan. 10, 1980

[51] Int. Cl.$^{3}$ .............................................. H03B 9/01

[52] U.S. Cl. ...................................... 331/79; 315/3.6; 315/39; 331/96

[58] Field of Search ........................ 331/79, 81, 82, 96; 315/3.5, 39, 39.3, 3.6, 1

[56] References Cited

U.S. PATENT DOCUMENTS

| | | | |
|---|---|---|---|
| 2,634,372 | 4/1953 | Salisbury | 315/1 |
| 4,074,211 | 2/1978 | Bates | 315/3.5 X |

OTHER PUBLICATIONS

Born et al., Principles of Optics, 5th edition, Pergamon Press, Oxford, 1975, pp. 66–70.

Culshaw, Proc. Phys. Soc. 66B, 1953, pp. 597–608 "The Fabry-Perot Interferometer at Millimetre Wavelengths".

*Primary Examiner*—Siegfried H. Grimm

*Attorney, Agent, or Firm*—Nathan Edelberg; Robert P. Gibson; Saul Elbaum

[57] ABSTRACT

A high frequency electromagnetic wave generator is disclosed which comprises an electron gun which directs an electron beam through a region generally adjacent a diffraction grating. The grating cooperates with an opposed reflecting surface to produce a standing electromagnetic wave. The reflector comprises a highly reflective dielectric coated mirror. Supporting means for the diffraction grating may also comprise a reflective dielectric surface.

8 Claims, 1 Drawing Figure

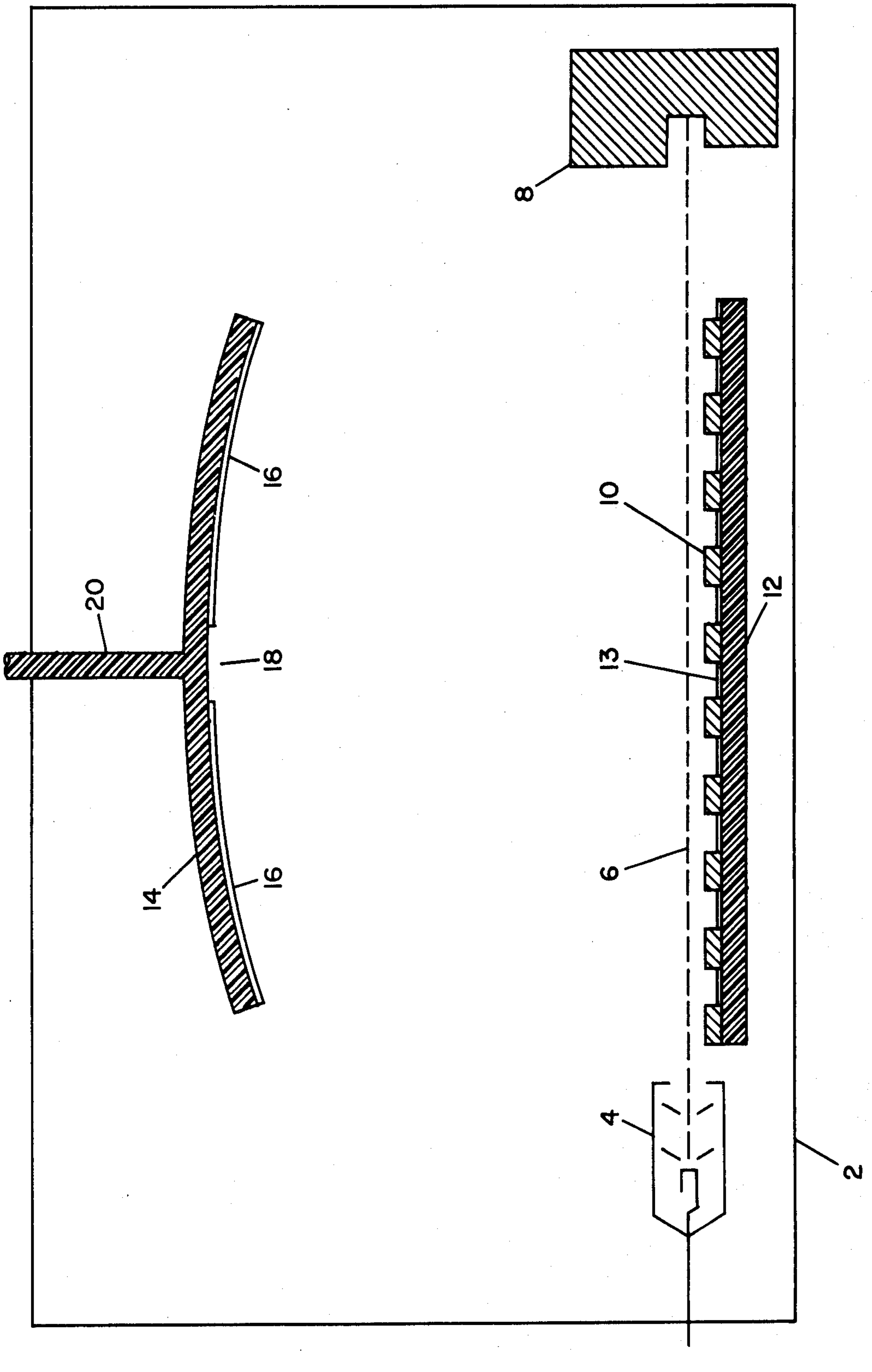
8
10
12
13
6
4
2
20
18
16
16
14

NEAR MILLIMETER WAVE GENERATOR WITH DIELECTRIC CAVITY

RIGHTS OF THE GOVERNMENT

The invention described herein may be manufactured and used by or for the Government of the United States of America for governmental purposes without payment to use of any royalties thereon.

BACKGROUND OF THE INVENTION

A new type of electron tube has evolved over the last two decades called the Orotron, Ledatron or Diffraction Radiation Generator. The tube generally consists of an electron beam generator and collector and a Fabry-Perot cavity containing one grooved metallic mirror or grating and one smooth metallic mirror. The principle of operation of these devices is based on the Smith-Purcell effect or Salisbury effect. These devices generate electromagnetic radiation and are made tunable by either changing the electron beam voltage and/or by relative mechanical displacement of the metal mirrors.

Exemplary of such devices is that disclosed in U.S. Pat. No. 2,634,372 to Salisbury. The device of the patent comprises generally an electron gun which directs an electron beam into a region generally adjacent a metallic diffraction grating. An opposed metallic reflecting mirror cooperates with the diffraction grating to establish a standing electromagnetic wave. The electron beam passing through the standing wave increases the amplitude of the standing wave pattern, thus increasing the energy contained in the standing wave. The energy produced may be taken off through an output means. In order to control the frequency of the generated radiation the angle between the reflecting mirror and the diffraction grating must be adjusted. This requires a somewhat complex structure and precise control over the position of the movable reflector.

Another drawback of the prior art devices is that at very high frequencies metal conduction losses can become severe so as to lower the Q of an open resonator. This can become quite severe for wavelengths of approximately one millimeter or less. This reduction in Q lowers the efficiency of the generator.

Accordingly, it is an object of the invention to provide means to improve the efficiency of an open resonator structure such that the radiation generator may operate efficiently at sub-millimeter wavelengths.

It is an object of the invention to construct an electromagnetic wave generator having few metallic parts, thereby improving the cavity Q, thus enabling the generator to operate at higher efficiencies.

It is another object of the invention to provide an electromagnetic wave generator which may be tuned without the use of complex and costly positional adjustment means for the reflecting surfaces.

It is a further object of this invention to improve the spectral purity of the radiation generated by the wave generator.

SUMMARY OF THE INVENTION

The invention comprises a vacuum chamber containing an electron gun and electron receiver for generating an electron beam within the chamber. The electron beam traverses a path generally adjacent a diffraction grating. An opposed reflective mirror cooperates with the diffraction grating to establish a standing electromagnetic wave. The reflecting mirror and the support means for the diffraction grating are both composed entirely of dielectric materials. In this manner, metallic conduction losses at high frequencies are eliminated.

Both the reflecting mirror and the dielectric support means for diffraction grating are made selectively reflective of chosen radiation frequencies. This is accomplished by coating the surfaces with alternating layers of dielectric materials having quarter-wavelength thicknesses. That is, the thickness of each individual layer of the reflective surface is one fourth the wavelength of the radiation in the selected dielectric medium. Using this technique, the surfaces may be made reflective of any selected wavelength or frequency by choosing appropriate dielectric materials to comprise the reflective surfaces.

BRIEF DESCRIPTION OF THE DRAWING

The single FIGURE illustrates the essential features of the present invention.

DESCRIPTION OF THE PREFERRED EMBODIMENT

Referring to the FIGURE, reference numeral 2 schematically illustrates an impervious envelope which incloses the apparatus in a vacuum. Electron gun 4, which may be of any conventional type, directs electron beam 6 toward the electron collector 8. The electron beam passes adjacent a diffraction grating which is comprised of metallic elements 10 arranged transversely to the direction of travel of the electrons. The elements 10 are supported on dielectric base 12. Thus, the only metallic surface presented to the electron beam is the diffraction grating made up of elements 10. The dielectric base 12 has thereon a reflective surface 13, which will be discussed in greater detail hereinafter.

A reflector is arranged in opposed relation to the diffraction grating. The reflector comprises dielectric base 14 having a reflective surface 16 thereon. A dielectric waveguide 20 is operatively attached to the reflector to enable electromagnetic radiation produced by the generator to be conducted therefrom. A gap or space 18 in the reflective coating 16 allows radiation to pass from the generator cavity to the waveguide 20.

The upper mirror 14 is shown as being spherical in shape to direct radiation to the waveguide 20. It is to be understood that this mirror may take other configurations as well. The reflecting base 12, 13 is shown as a plane mirror, but it is to be understood that this also may assume other configurations. Also, the distance between the base 12 and the reflector 14 may be made adjustable.

Reflective surfaces 13 and 16 are composed of multiple dielectric layers. It is well known in optics that for highly reflective surfaces maximum reflectivity is provided by choosing so called "quarter wave layers". Alternating layers of differing dielectric materials are provided. For maximum reflectivity of a chosen wavelength,, the thickness of each individual layer is chosen to be one-fourth the selected wavelength in the respective dielectric medium. If the frequency of the incident radiation varies so that the wavelength differs appreciably from the selected wavelength, the surface will no longer reflect strongly. This technique is discussed in *Principle of Optics,* fifth edition, Pergamon Press, Oxford, 1975, pages 66–70 and in W. Culshaw, Proc. Phys. Soc. 66B, 597 (1953).

The cited reference to Culshaw gives as an example of the use of multiple dielectric layers for reflectors in the millimeter wavelength range alternating layers of polystyrene and air. Another, perhaps better combination for the present purpose would be alternating layers of germanium (index of refraction 4.03) and TPX, a plastic (index of refraction 1.43). The required thicknesses for a wavelength of 4 millimeters would be 248 microns for germanium and 699 microns for TPX. No special technology is required to manufacture layers of these thicknesses.

The present invention provides an operable electromagnetic wave generator without the use of numerous metallic elements. Therefore, when generating radiation of high frequency inefficiencies due to metallic conduction losses are eliminated.

The reflective surfaces of the device are reflective of particular frequencies, depending upon the dielectric materials used to coat the reflectors, as discussed above. Therefore, a particular combination of dielectric coatings will enhance a desired frequency while supressing unwanted frequencies. The apparatus can be tuned to produce radiation of a chosen frequency by changing the materials used to coat the reflective surfaces. The generator may therefore be tuned without the use of movable mirrors. Also, the spectral purity of the produced radiation is higher than that of the prior are devices. This is due to the fact that the reflectivity of the surfaces of the present invention can be readily and closely controlled by appropriate selection of dielectric coatings.

Although the invention has been disclosed with reference to the accompaning drawing, we do not wish to be limited to the details shown therein as obvious modifications can be made by those skilled in the art.

We claim:

1. Apparatus to generate radiation comprising; means to generate a beam of electrons; a diffraction grating generally adjacent the path of said electron beam; and a reflector means cooperating with said diffraction grating to set up a standing electromagnetic wave pattern through which the electron beam passes; wherein said reflector means comprises substantially only dielectric materials.

2. Apparatus as in claim 1, wherein said reflector means comprises a dielectric base member having selected dielectric coatings thereon.

3. Apparatus as in claim 2, wherein the coatings are so chosen as to reflect radiation of a selected wavelength.

4. Apparatus as in claim 3, wherein said coatings comprise alternate layers of differing dielectric materials, the thickness of each of said layers being substantially equal to one-fourth of said selected wavelength in the respective dielectric medium.

5. Apparatus as in claim 2, further comprising output means for radiation generated by said apparatus, said output means comprising a dielectric waveguide.

6. Apparatus as in claim 5, wherein said dielectric waveguide is operatively connected to the base of said reflector means, a portion of said base member adjacent said waveguide being free of said coatings.

7. Apparatus as in claim 1, wherein said diffraction grating is embedded in a dielectric base having a surface highly reflective of radiation of a selected wavelength.

8. Apparatus as in claim 7, wherein said surface comprises alternate layers of differing dielectric materials, the thickness of each of said layers being substantially equal to one-fourth of said selected wavelength in the respective dielectric medium.

* * * * *